US011581891B2

United States Patent
Schmachtenberger et al.

(10) Patent No.: US 11,581,891 B2
(45) Date of Patent: Feb. 14, 2023

(54) ANALOG COMPARATOR CIRCUIT FOR COMMUNICATION INTERFACES WITHIN A VEHICLE

(71) Applicant: ZF Friedrichshafen AG, Friedrichshafen (DE)

(72) Inventors: Philipp Schmachtenberger, Regensburg (DE); Christian Aigner, Regensburg (DE); Ulrich Schmidt, Friedrichshafen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 17/554,706

(22) Filed: Dec. 17, 2021

(65) Prior Publication Data

US 2022/0200593 A1 Jun. 23, 2022

(30) Foreign Application Priority Data

Dec. 18, 2020 (DE) .................. 10 2020 216 233.6

(51) Int. Cl.
*H03K 17/00* (2006.01)
*H03K 17/687* (2006.01)
(Continued)

(52) U.S. Cl.
CPC .......... *H03K 17/6872* (2013.01); *H03K 5/24* (2013.01); *H03K 17/693* (2013.01)

(58) Field of Classification Search
None
See application file for complete search history.

(56) References Cited

U.S. PATENT DOCUMENTS 4,510,425 A * 4/1985 Yokota ............... G05D 16/2066
417/44.1
5,268,643 A * 12/1993 Aso ..................... B60R 21/0173
73/865.9

(Continued)

FOREIGN PATENT DOCUMENTS

DE 101 39 243 A1 3/2003
DE 10 2016 221 477 A1 5/2018

OTHER PUBLICATIONS

German Search Report Corresponding to 10 2020 216 233.6 dated Aug. 4, 2021.

*Primary Examiner* — Tuan T Lam
(74) *Attorney, Agent, or Firm* — Finch & Maloney PLLC

(57) ABSTRACT

A vehicle analog comparator circuit for communication interfaces designed to detect an actuation of an actor. The circuit comprises a unit for producing a supply voltage for supplying the actor, a unit for producing a reference voltage to be compared with the supply voltage, a transistor input stage, a node point EDMx between the actor, the unit for producing a supply voltage and the transistor input stage, and a digital evaluation unit to process the output signal from the transistor input stage such that whether or not the actor is actuated is detected. The transistor input stage comprises a transistor circuit with a first transistor is connected to the node point EDMx, and a second transistor connected to the reference voltage. A collector resistance for limiting the collector current of the second transistor, as well as a base resistance for the two transistors. Alternatively, a current mirror is provided.

9 Claims, 2 Drawing Sheets

(51) Int. Cl.
    *H03K 17/693*     (2006.01)
    *H03K 5/24*     (2006.01)

(56) References Cited

U.S. PATENT DOCUMENTS

| | | | | |
|---|---|---|---|---|
| 10,038,579 | B1 * | 7/2018 | Muellner | H04L 27/12 |
| 2016/0091908 | A1 * | 3/2016 | Edwards | G05F 1/56 |
| | | | | 323/274 |
| 2016/0238658 | A1 * | 8/2016 | Edwards | G01R 31/3277 |

* cited by examiner

ANALOG COMPARATOR CIRCUIT FOR COMMUNICATION INTERFACES WITHIN A VEHICLE

This application claims priority from German Patent Application Serial No. 10 2020 216 233.6 filed on Dec. 18, 2020.

FIELD OF THE INVENTION

The present invention relates to an analog comparator circuit for communication interfaces within a vehicle.

BACKGROUND OF THE INVENTION

In vehicles, it is often necessary to determine whether or not an actor, such as a switch or button, is actuated. As a rule this happens by a comparison of positive and negative analog voltages with a specified reference voltage. For that, until now, a comparator circuit with operational amplifiers has been used, wherein the comparator input is usually provided by means of a Z-diode or a voltage divider and, in that way, is designed to be surge-proof. A disadvantage of this, above all, is that a negative voltage supply is needed.

SUMMARY OF THE INVENTION

Accordingly, the purpose of the present invention is to provide an improved analog comparator circuit for communication interfaces within a vehicle. According to the invention, this objective is achieved by the features specified in the independent claims. Advantageous embodiments are the object of the dependent claims.

An analog comparator circuit for communication interfaces within a vehicle is proposed, which is designed to detect an actuation of an actor, and which comprises:
- a unit for producing a supply voltage for supplying the actor,
- a unit for producing a reference voltage to be compared with the supply voltage,
- a transistor input stage,
- an EDMx node point between the actor, the unit for producing a supply voltage and the transistor input stage,
- a digital evaluation unit, designed to process the output signal of the transistor input stage in such a manner that it is detected whether or not the actor is actuated. Furthermore, the transistor input stage is in the form of an analog transistor input stage comprising a transistor circuit with two transistors, of which an emitter of a first transistor is functionally connected to the EDMx node point, and the emitter of a second transistor is functionally connected to the reference voltage at the reference node, and further comprising a collector resistance associated with the second transistor for limiting the collector current of the second transistor and a base resistance for both transistors.

Alternatively, a current mirror is produced, which comprises two transistors, of which a first transistor is functionally connected to the EDMx node and the second transistor is functionally connected to the reference voltage and is configured in the current feedback mode.

By virtue of the proposed circuit, the previously necessary negative voltage source can be omitted and unintentional signal variations at the output of the operational amplifier can be avoided.

In an embodiment, a KS diode is provided between the reference voltage and the emitter of the second transistor, arranged in such a manner that it acts as a short-circuit protection of the base-emitter-diode of the second transistor in the event of a short-circuit at the EDMx node point. Thus, the diode prevents a breakthrough of the base-emitter-diode of the transistor in the blocking direction.

In an embodiment, moreover, a temp diode is provided between the EDMx node point and the emitter of the first transistor, arranged in such a manner that it compensates the forward voltage drop or a voltage drop in the pass direction through the KS diode relative to the reference voltage. At the same time, the diode also prevents the base-emitter diode of the first transistor from breaking through in the blocking direction when the reference voltage VREF is higher than the voltage at the EDMx node.

In an embodiment the KS diode and the temp diode are chosen from the same assembly. In that way as little scatter as possible of the diode voltage is achieved.

In an embodiment, a hysteresis unit is provided, which is designed such that it reduces the reference voltage in the event that the second transistor is active, owing to a higher voltage than the reference voltage at the EDMx node point.

In an embodiment, in the hysteresis unit a PD resistance is also provided, which is arranged between the collector of the first transistor and the input of the hysteresis unit. Thanks to the PD resistance, the leakage currents flowing through the first transistor are higher but the potential is lower, so that the transistor of the hysteresis unit is not active.

In an embodiment the actor is a switch or a button.

Furthermore, an application of the analog comparator circuit in a transmission control unit of a vehicle, which can be a passenger car or a truck, is envisaged.

Further features and advantages of the invention emerge from the description given below, of example embodiments of the invention, with reference to the figures in the drawing, which shows details according to the invention, and from the claims. The individual features can be used in isolation as such, or realized in any combination in several variants of the invention.

BRIEF DESCRIPTION OF THE DRAWINGS

Preferred embodiments of the invention are explained in greater detail below, with reference to the attached drawing.

DETAILED DESCRIPTION OF THE PREFERRED EMBODIMENTS

In the figure descriptions below, the same elements or functions are given the same indexes.

Figure 1:
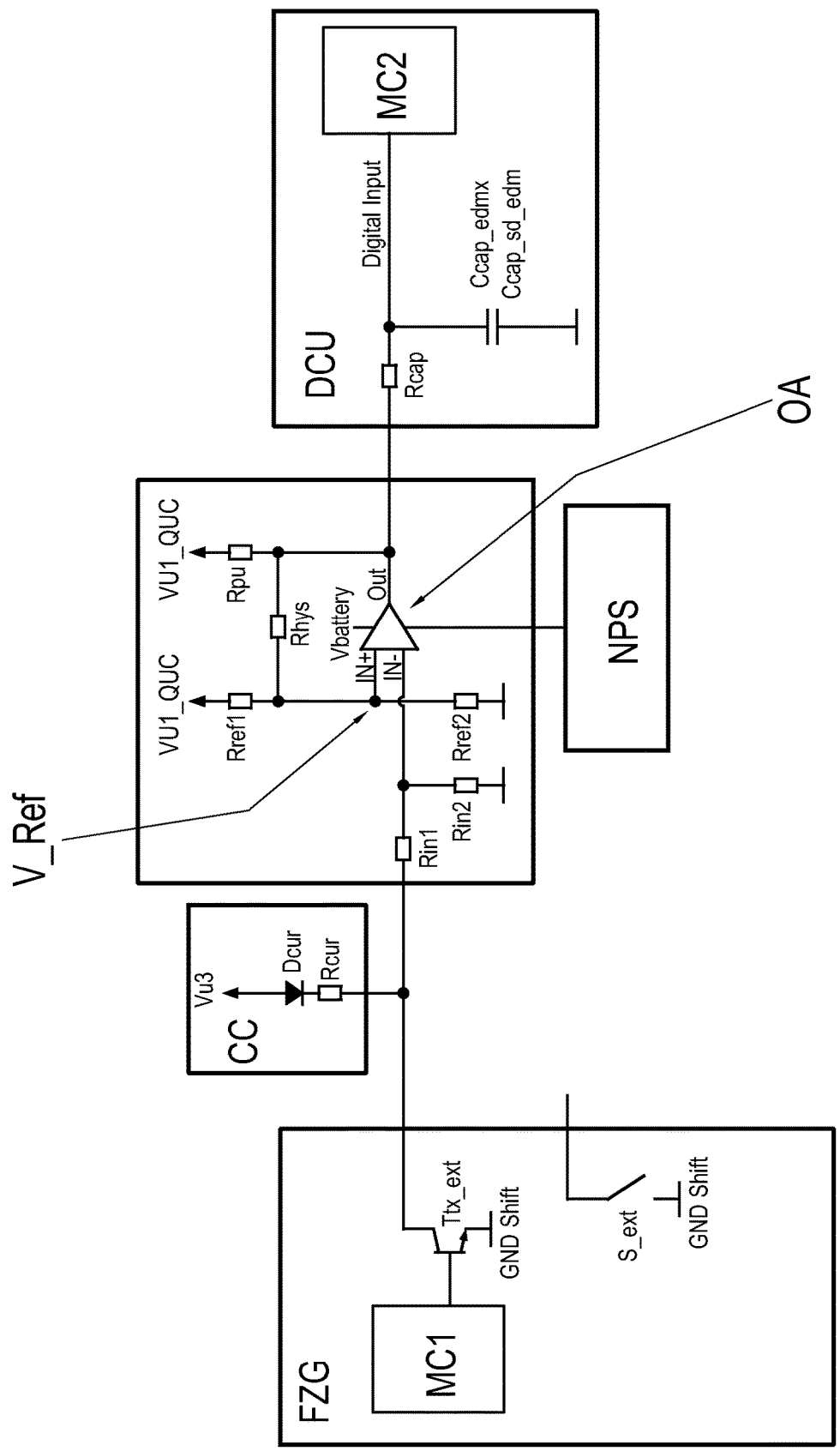
FIG. 1 shows a circuit diagram with an operational amplifier in the comparator input stage and a negative voltage supply NPS, according to the prior art.
Figure 2:
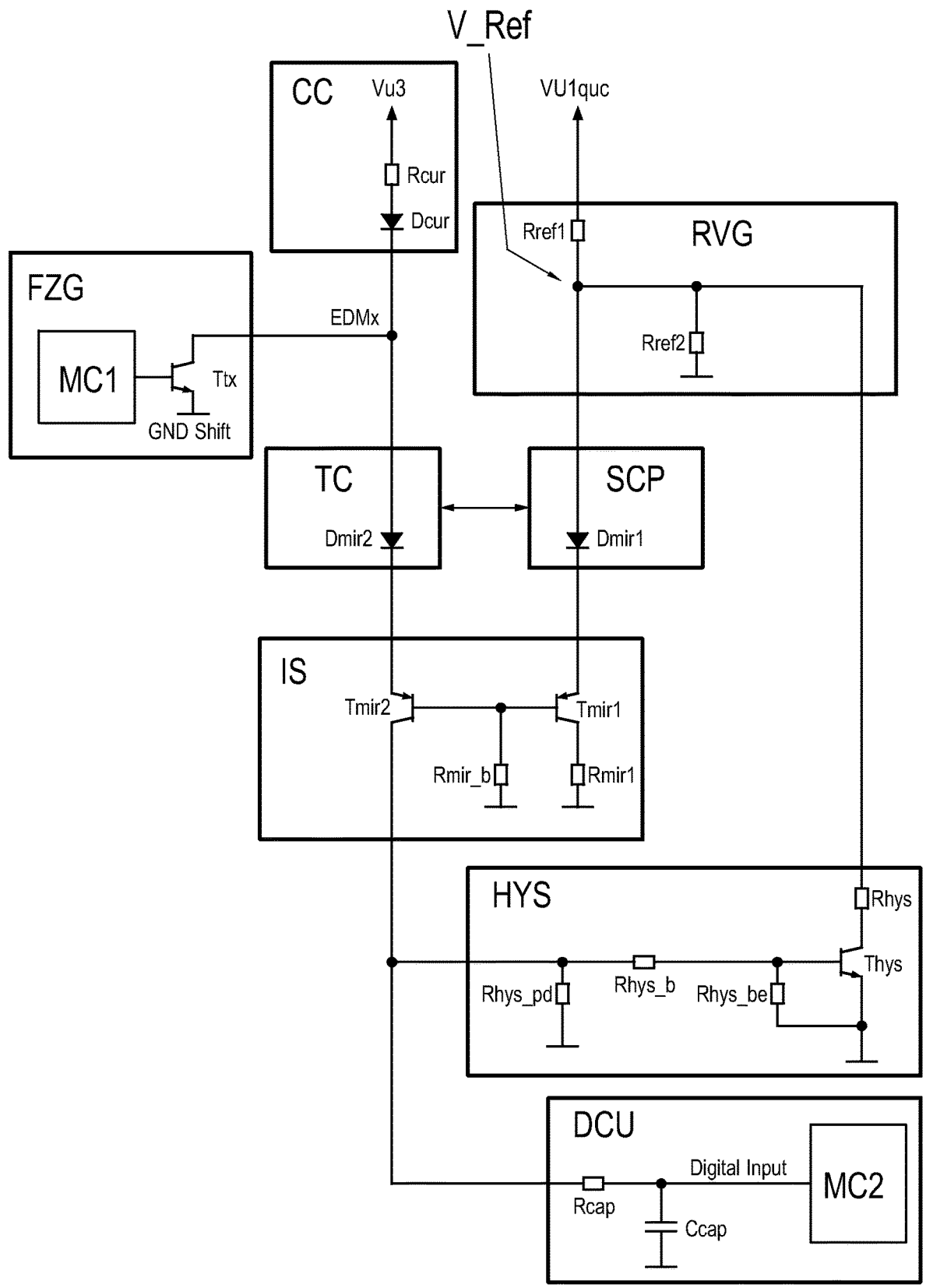
FIG. 2 shows a circuit diagram with an analog comparator circuit, according to an embodiment of the present invention.

FIG. 1 shows a circuit diagram with an operational amplifier in the comparator input stage and a negative voltage supply NPS, according to the prior art. FIG. 2 shows a preferred embodiment of a circuit diagram according to the present invention.

In all the figures, the following blocks are essentially of identical form.

| | |
|---|---|
| FZG | Vehicle block, which comprises an actor to be monitored, in this case as a switch or button in the form of a transistor Ttx or a mechanical switch S_ext, and optionally further components such as a microcontroller MC1 |
| CC | Contact current block, i.e., the provision of the current or voltage supply for the switch S_ext or button Ttx of the FZG block via Vu3, which contains a resistance Rcur and a diode Dcur for safeguarding the supply voltage Vu3 against a short-circuit to the battery |
| EDMx | Node point between FZG, CC and the transistor input stage IS described below |
| RVG | Unit for producing a reference voltage V_Ref from the reference voltage source VU1_QUC. RVG consists of a current divider with two resistances Rref1 and Rref2 |
| HYS | Hysteresis unit with a hysteresis resistance Rhys and other components, which reduces a specified positive reference voltage V_Ref to a desired level |
| DCU | Digital Capture Unit, i.e., the evaluation unit, which receives the output signal of the transistor input stage IS described below and sends it via the resistance Rcap and the condenser Ccap to the microcontroller MC2 for further processing, in order to determine whether or not the switch S_ext or button Ttx is activated. In other words, a transformation of the result of the analog voltage comparison of EDMx with the reference voltage V_Ref takes place at the digital voltage level. In this case, Rcap also limits the current passing into the microcontroller MC2 for EDMx voltages which are higher than the supply voltage of the microcontroller MC2. |

In the prior art as shown in FIG. 1, the input stage of the comparator circuit is provided in the form of an inverted operational amplifier OA with hysteresis control by virtue of the resistances Rin1 and Rin2 at its negative input IN−, and Rref1 and Rref2 at its positive input IN+. The hysteresis resistance Rhys is controlled by the output of the operational amplifier OA, so that it is connected either to ground or to VU1_QUC. Thus, it is always between Rref1 and Rref2 and so the switching threshold varies as a function of the comparator output.

In vehicles, particularly utility vehicles such as trucks, the problem exists that owing to the large line lengths in the vehicle and owing to the high electrical current flow, a ground offset takes place, i.e., the mass potential, also denoted by GND or ground, of the control unit is higher compared with the ground or GND of the vehicle. Thus, negative voltage signals can also result which, in previously known circuit arrangements as illustrated for example in FIG. 1, can lead to inadvertent signal changes at the output of the operational amplifier OA, such as so-termed 'bit flips', i.e., an unintended change at the output of the operational amplifier. In other words, this therefore no longer works within its control range, also called its Input-Common-Mode Range, and accordingly shows undefined behavior. Thus, the downstream microcontroller MC2 receives no clear signal. To avoid the problem outlined, an additional negative voltage supply NPS is also provided in FIG. 1. This takes up fitting space and is comparatively expensive.

A further disadvantage of the circuit shown in FIG. 1 is that if too high a positive voltage is applied to the operational amplifier OA, the amplifier can be destroyed. Precisely in vehicle applications higher battery voltages are often used, so that, as in FIG. 1, the circuit must be designed with corresponding voltage dividers Rin1 and Rin2 or with a Z-diode, which reduces its accuracy. Alternatively, more expensive operational amplifiers OA have to be used. Basically, the aim is to prevent the voltage at the inputs of the operational amplifier from rising above its supply voltage.

On the basis of that knowledge, the aim of the invention is to provide a comparator circuit in which the same function, i.e., to determine whether a switch S_ext or button Ttx is or is not active, can be achieved by simple means.

This is done by producing a circuit arrangement in which an analog comparison, between positive and negative voltage signals relative to a reference voltage, takes place. A preferred embodiment is shown in detail in FIG. 2 and is described below. Essentially, the blocks outlined in FIG. 1, or more precisely essential components thereof, are replaced, i.e., in particular the operational amplifier OA. In addition, the negative voltage supply NPS is omitted.

In this proposed circuit arrangement, the operational amplifier OA is replaced by a simpler analog transistor input stage IS. This enables an analog comparison between positive and negative voltage signals relative to a positive reference voltage and digital processing of the resulting voltage signal in the Digital Capture Unit DCU. This transistor input stage IS has the advantage that a negative voltage supply NPS is no longer needed.

In this case, the analog transistor input stage can comprise two transistors Tmir1 and Tmir2. The reference voltage V_Ref, at the reference node V_Ref, is produced by the system voltage of the control system, i.e., the reference voltage source VU1quc, and voltage divider present in the unit for producing a reference voltage RVG, and acts upon the transistor Tmir 1 with a pilot voltage. In addition, a resistance Rmir1 is provided, which limits the collector current from Tmir1. The resistance Rmir1 has a high impedance so that it influences the reference voltage V_Ref as little as possible. In addition, a base-resistance Rmir_b is provided for both transistors Tmir1 and Tmir2 relative to ground GND. This should have an impedance so low that Tmir1 can control the hysteresis unit HYS, and an impedance high enough for the reference voltage V_Ref to be as little influenced as possible.

The transistor Tmir2 compensates the base-emitter diode of Tmir1 and thus compares the voltage at the EDMx node (also called the EDMx-pin) with the reference voltage V_Ref. In other words, the voltage at the EDMx node is compared with the reference voltage V_Ref at the node V_Ref.

Alternatively, the transistor input stage IS can also be made from a current mirror (not shown). In this case Tmir1 is configured in a current feedback mode, whereby a very small base current results for Tmir1. Here, it is advantageous that the reference voltage V_Ref is influenced very little. However, the base currents are so small that the EDMx node can easily be affected by electric interferences. For that reason, the previously mentioned design of the transistor input stage IS shown in FIG. 2 is the preferred form.

In addition, in a simple and efficient way a short-circuit resilience of the voltage input, i.e., a short-circuit protection SCP with temperature compensation TC, can be realized. The temperature compensation TC compensates the influence of the short-circuit protection SCP on the accuracy of the signal capture over the temperature range. The short-circuit protection SCP is realized by means of a KS diode Dmir1, which is arranged between the RVG unit and the transistor Tmir1, and which serves to protect the base-emitter current of the transistor Tmir1 and the reference voltage in the event of a short-circuit between the switch S_ext or button Ttx and the supply voltage Vu3. In other words, a breakthrough of the base-emitter diode in the blocking direction is prevented and, therefore, the transistor and downstream components such as the reference voltage source VU1quc are protected.

Furthermore, it is advantageous to provide a temperature compensation TC, which is realized by a temp-diode Dmir2, which is arranged between the EDMx node and the transistor Tmir2 and which compensates the forward voltage drop by means of the KS diode Dmir1 relative to the reference voltage V_Ref for the comparator input stage. Advantageously, diodes Dmir1 and Dmir2 of the same assembly are used. This means that to achieve the least possible scatter of the diode voltage, the diodes should be in the same housing, i.e., in the same component or the same assembly. In contrast to a previous short-circuit protection SCP, the short-circuit protection SCP proposed in the present circuit is neither part of the operational amplifier nor in the form of a separate negative voltage supply NPS, but in the form of diodes Dmir1 and Dmir2 in the signal line, which are just as effective. Since the diode Dmir2 compensates the diode voltage of Dmir1 and, at the same time, prevents a breakthrough of the base-emitter diode of Tmir2 at voltages at the EDMx-pin (node) considerably below the reference voltage V_Ref at the node V_Ref, the previous problem of the negative modulation range is solved.

As in the known circuit, so also in the proposed new circuit arrangement with an analog transistor input stage IS, a hysteresis control can take place, which is the figures is denoted as the hysteresis unit HYS.

In FIG. 1, the circuit summarized in FIG. 2 under HYS is integrated with the part in the operational amplifier OA in which a positive reference voltage is reduced to a desired level, i.e., the hysteresis is realized by way of Rhys, Rpu and the open-drain output of the OP. This part consists of a transistor Thys and two resistances Rhys_be (base-emitter resistance) and Rhys_b (base resistance). By virtue of the transistor Thys and the resistance Rhys the reference voltage V_Ref is reduced in the case when Tmir2 of the comparator input stage is active. This is active when the reference voltage V_Ref is higher compared with the input voltage Vu3 (at the EDMx-pin). Thus, Tmir2 is active when the voltage at the EDMx node is higher than the reference voltage V_Ref at the reference node V_Ref. between Rref1 and Rref2.

The resistance Rhys_pd ensures that in the case when the (potential-increasing) leakage currents flow via the transistor Tmir2, the transistor Thys also associated with the hysteresis unit HYS is not (inadvertently) active. The resistance Rhys_pd is not absolutely needed for voltages at the digital level, i.e., up to around 5 V, since in that range it is probable that very small leakage currents flow through Tmir2. By omitting the resistance Rhys_pd, higher impedances can be produced, which is advantageous particularly in the case of low voltages since the input signal at the EDMx-pin is then less severely loaded. However, collector-emitter leak currents of the transistor Tmir1 are higher when the circuit is used with battery voltages for the reference and/or input voltage, i.e., voltages for example of 12V, 24V, 36V or other battery voltages used in the vehicle which are higher than about 5 V. It is then better to provide the resistance Rhys_pd, in order to avoid a random or inadvertent activation of the hysteresis control. The higher signal voltages can more easily drive the additional current through the resistance Rhys_pd.

Thanks to the analog structure of a comparator input stage IS, there is no need to produce a negative voltage supply from a separate voltage supply NVG. Thus, the problem that the Input-Common-Mode voltage cannot be maintained, is eliminated, i.e., also that no undesired bit-flips can occur. At the same time, the short-circuit resilience of the voltage input is provided with temperature compensation TC, which compensates the influence of the short-circuit protection on the accuracy of the signal capture over the temperature range concerned.

Thus, thanks to the proposed simplified transistor input stage IS, components and costs are saved, and the circuit is simplified without thereby sacrificing any functionality. On the contrary, it is made even more robust since no bit-flips can occur.

INDEXES

FZG Vehicle with an actor (switch S_ext/button Ttx) to be monitored
CC Contact current for supplying current to the actor (S_ext/Ttx)
DCU Digital Capture Unit or evaluation unit
HYS Hysteresis unit
RVG Unit for producing a reference voltage V_Ref
EDMx Node point between FZG, CC and IS
V_Ref Reference node between Rref1 and Rref2 and reference voltage
NPS Negative voltage supply, Negative Power Supply
IS Input stage or transistor input stage
TC Temperature compensation
SCP Short-circuit protection
MC1, MC2 Microcontroller
OA Operational amplifier

The invention claimed is:
1. An analog comparator circuit, for communication interfaces within a vehicle which is designed to detect an actuation of an actor, comprising:
   a unit for producing a supply voltage for supplying the actor,
   a unit for producing a reference voltage to be compared with the supply voltage,
   a transistor input stage,
   a node point between the actor, the unit for producing a supply voltage and the transistor input stage,
   a digital evaluation unit for processing an output signal from the transistor input stage to detect whether or not the actor is actuated,
   wherein the transistor input stage is in the form of an analog input stage that comprises:
   a transistor circuit with two transistors, of which an emitter of a first transistor is functionally connected to the node point and an emitter of a second transistor is functionally connected to the reference voltage at the reference node, further comprising a collector resistance associated with the second transistor for limiting collector current of the second transistor, as well as a base resistance produced for both of the first and the second transistors;
   or
   a current mirror comprising two transistors, of which a first transistor is functionally connected to the node point and a second transistor is functionally connected to the reference voltage and is configured in a current feedback mode.
2. The analog comparator circuit according to claim 1, further comprising a KS diode arranged between the reference voltage and the emitter of the second transistor in such a manner that the KS diode acts as a short-circuit protection of the base-emitter diode of the second transistor in an event of a short-circuit at the node point.
3. The analog comparator circuit according to claim 2, further comprising a temp diode arranged between the node point and the emitter of the first transistor, in such a manner that the temp diode compensates a forward voltage drop through the KS diode relative to the reference voltage.

4. The analog comparator circuit according to claim 3, wherein the KS diode and the temp diode are chosen from a same assembly.

5. The analog comparator circuit according to claim 1, wherein a hysteresis unit is provided, which is designed to reduce the reference voltage in a case when, owing to a higher voltage than the reference voltage at the node point (Electric machine), the second transistor is active.

6. The analog comparator circuit according to claim 5, wherein a PD resistance is provided in the hysteresis unit, which is arranged between a collector of the first transistor and the input of the hysteresis unit.

7. The analog comparator circuit according to claim 1, wherein the actor is a switch or a button.

8. A use of the analog comparator circuit according to claim 1 in a transmission control unit of a vehicle, including a passenger car or a truck.

9. The use of the analog comparator circuit according to claim 1 in a transmission control unit of one of a passenger car or a truck.

* * * * *